(12) United States Patent
Hollmer

(10) Patent No.: US 6,272,043 B1
(45) Date of Patent: Aug. 7, 2001

(54) APPARATUS AND METHOD OF DIRECT CURRENT SENSING FROM SOURCE SIDE IN A VIRTUAL GROUND ARRAY

(75) Inventor: Shane Hollmer, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/602,328

(22) Filed: Jun. 23, 2000

Related U.S. Application Data

(60) Provisional application No. 60/178,604, filed on Jan. 28, 2000.
(51) Int. Cl.[7] ................................................. G11C 16/04
(52) U.S. Cl. ................................. 365/185.16; 365/185.2; 365/185.21
(58) Field of Search ........................... 365/185.16, 185.2, 365/185.21

(56) References Cited

U.S. PATENT DOCUMENTS

| 4,173,766 | 11/1979 | Hayes . |
| 4,868,790 | * 9/1989 | Wilmoth et al. ................ 365/185.21 |
| 5,280,446 | 1/1994 | Ma et al. . |
| 5,287,315 | * 2/1994 | Schreck et al. ............. 365/185.16 X |
| 5,349,221 | 9/1994 | Shimoji . |
| 5,768,192 | 6/1998 | Eitan . |
| 5,825,686 | 10/1998 | Schmitt-Landsiedel et al. . |
| 5,847,998 | 12/1998 | Van Buskirk . |
| 5,867,430 | 2/1999 | Chen et al. . |

FOREIGN PATENT DOCUMENTS

| 2 157 489 | 10/1985 | (GB) . |
| WO 99/07000 | 2/1999 | (WO) . |

* cited by examiner

Primary Examiner—Huan Hoang
(74) Attorney, Agent, or Firm—Wagner, Murabito & Hao LLP

(57) ABSTRACT

A virtual ground array based flash memory device includes a virtual ground array containing individual memory elements with supporting input/output circuitry. The input/output circuitry contains circuitry for addressing the memory elements as well as transferring data to and from the array, reference circuitry, and comparison circuitry. During sensing, the drains of selected memory elements in the virtual ground array are set to a specific voltage level while the sources of the selected memory elements are used as the sense outputs. The direct current output of one of the selected memory elements is transformed into a voltage and compared to a reference voltage. The direct current from the memory element is then determined by the output of the comparator. The present arrangement and method of sensing from the source side of selected memory elements in the virtual ground array both saves time and conserves power. Further, by using direct current from selected memory elements, a safe and efficient means of sensing is achieved.

28 Claims, 3 Drawing Sheets

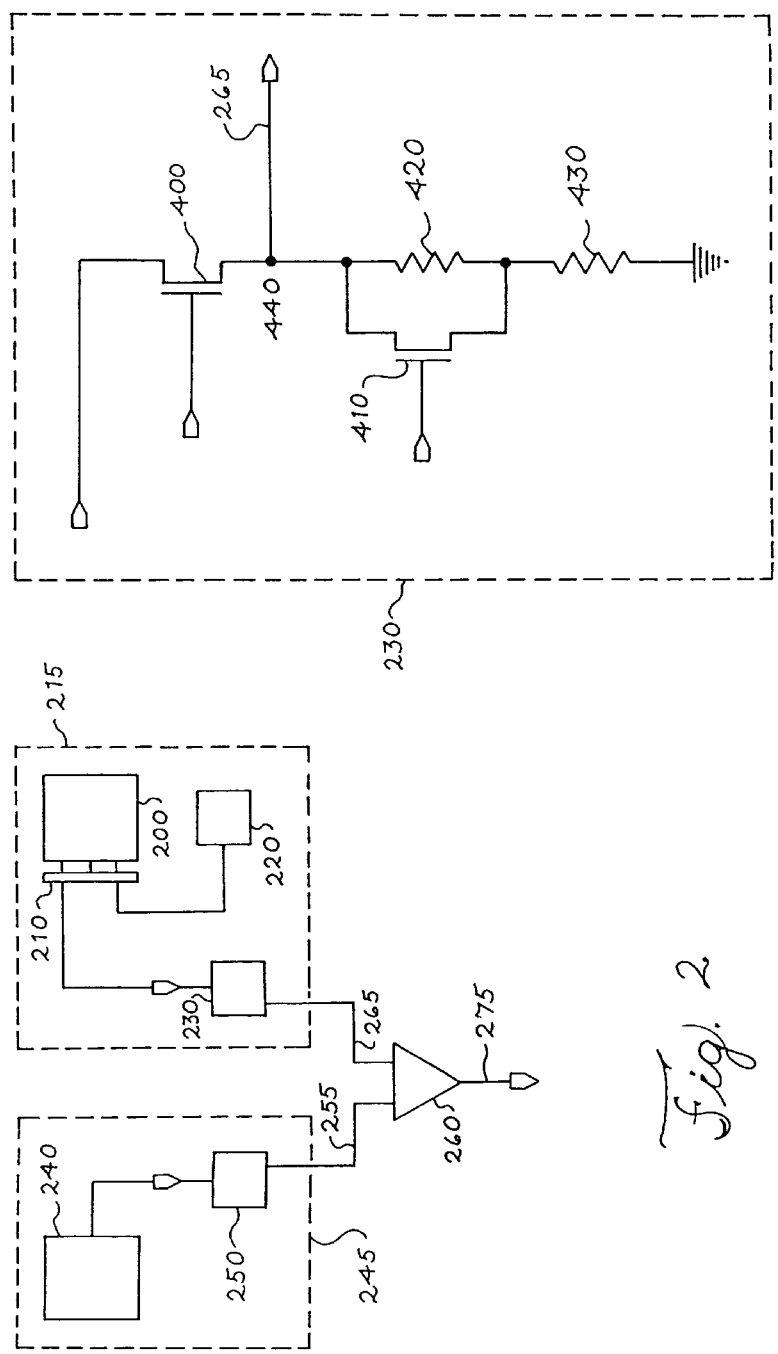

APPARATUS AND METHOD OF DIRECT CURRENT SENSING FROM SOURCE SIDE IN A VIRTUAL GROUND ARRAY

RELATED APPLICATION

This application is based on Provisional Application Serial No. 60/178,604 filed Jan. 28, 2000, which is incorporated herein by reference.

FIELD OF THE INVENTION

The present invention relates to the field of flash memory devices. More particularly, the invention relates to an apparatus and method of direct current sensing from the source side of a virtual ground array.

BACKGROUND OF THE INVENTION

The overall array architecture for a typical virtual ground array based flash memory device includes a virtual ground array accessed by a set of row decoders and a set of column decoders/multiplexors. The virtual ground array contains information stored in individual memory elements. The right and left row/word-line decoders are used to access specific memory rows within each memory block and the column decoder/multiplexor provides the input and output circuitry for each memory element.

The architecture of a virtual ground array comprises both individual memory elements and select gates. The memory elements are embodied in non-volatile transistors that may be programmed to a logic state of 0, 1, or other states depending on the particular type of transistor and programming used. The select gates are embodied in normal MOSFETs. Selectable word lines address both the control gates of the transistors that comprise the individual memory elements and select gates in the virtual ground array. Sets of memory elements are connected in series along each word line. The select gates are connected in pairs that are coupled to alternate select gate address lines. The pairs of select gates are connected with pairs of memory elements and a global bitline. A set of multiplexors control the columns that are connected to the external circuitry, such as the sensing circuitry and data-in path. The multiplexors are controlled by a set of column address decoders. Thus the decoders and multiplexors regulate the flow of data into and out of the virtual ground array.

Sensing using the drain side of the virtual ground array has a number of disadvantages. The main disadvantage of drain side sensing is that all the other bitlines connected with memory elements on the drain side not being sensed must be precharged to the drain voltage or higher before the sensing routine commences. Precharging the bitlines, in this case, wastes both time and power. Time is necessary to initiate, perform, and verify the precharging sequence when sensing from the drain side. Excess power is consumed in each of the precharge steps as well, for example decreasing battery lifetime for any portable electronics unit using the virtual ground array. A safe and accurate sensing scheme is needed that does not use sensing from the drain side of the virtual ground array.

BRIEF SUMMARY OF THE INVENTION

In view of the above, an apparatus and method of direct current sensing from the source side of a virtual ground array is provided.

A first aspect of the present invention is directed towards an apparatus of direct current sensing from the source side of a virtual ground array. The virtual ground array contains memory elements, of which each memory element has a source and a drain. A set of memory elements is selected from the virtual ground array and the drains are biased to the same potential. A comparison circuit is used to compare the direct current obtained from the source of a selected memory element in the virtual ground array with the output from a reference circuit. The direct current from the selected memory element is determined by the output of the comparator.

The comparison circuit comprises both a sense load and a reference load. The sense load transforms the direct current provided from the selected memory element into a sense voltage. Similarly, the reference load transforms a current provided from the reference circuit into a reference voltage. The sense and reference voltages are inputted to the comparator. The reference load and the sense load may have the same resistance values or may have different resistance values. If the resistance values are different, a sense ratio is created. The sense load may be variable and, if so, controls the sense margin for different operating states (erase, program, read) of the selected memory element.

The virtual ground array comprises select gates that are selectable by select lines. In addition, memory elements are selectable by individual word lines and at least two of the select gates. Local bitlines connect the select gates with the memory elements and global bitlines connect the select gates with the comparator. The memory elements are disposed along each word line and arranged in series along the word line. The virtual ground array is arranged in pairs of select gates and memory elements. Pairs of select gates are connected with partially overlapping pairs of memory elements. At least one multiplexor is connected between the virtual ground array and the comparator.

Another aspect of the invention is directed towards a method of direct current sensing from the source side of a virtual ground array. The method comprises a step of selecting a set of memory elements having a source and a drain contained in the virtual ground array. The direct current from the source of a selected memory element is compared with a reference output from a reference circuit via a comparator. The direct current from a selected memory element is determined using the output of the comparator.

The direct current is transformed into a sense voltage via a sense load, which is subsequently inputted to the comparator. A reference current is transformed into a reference voltage via a reference load, creating the reference output, which is subsequently inputted to the comparator. A variable sense load controls the sense margin different operating states (erase, program, read) of the selected memory element.

The virtual ground array used in the sensing method comprises select gates that are selectable by select lines. In addition, memory elements are selectable by individual word lines and at least two of the select gates. Local bitlines connect the select gates with the memory elements and global bitlines connect the select gates with the comparator. The memory elements are disposed along each word line and arranged in series along the word line. The virtual ground array is arranged in pairs of select gates and memory elements. Pairs of select gates are connected with partially overlapping pairs of memory elements.

The direct current of one of the selected set of memory elements in the virtual ground array is selected by at least one multiplexor. The multiplexors are connected between the virtual ground array and the comparator.

It is therefore a primary advantage of the present invention to achieve an effective, safe, and simple sensing approach from the source side for a virtual ground array by use of an apparatus or method of sensing direct current. The following figures and detailed description of the preferred embodiments will more clearly demonstrate these and other objects and advantages of the invention.

BRIEF DESCRIPTION OF SEVERAL VIEWS OF THE DRAWINGS

FIG. 2 shows the overall architecture of the direct current sensing apparatus according to the invention.

FIG. 4 shows the architecture of a sensing transfer circuit according to the invention.

DETAILED DESCRIPTION OF THE PRESENTLY PREFERRED EMBODIMENTS OF THE INVENTION

Figure 1A:
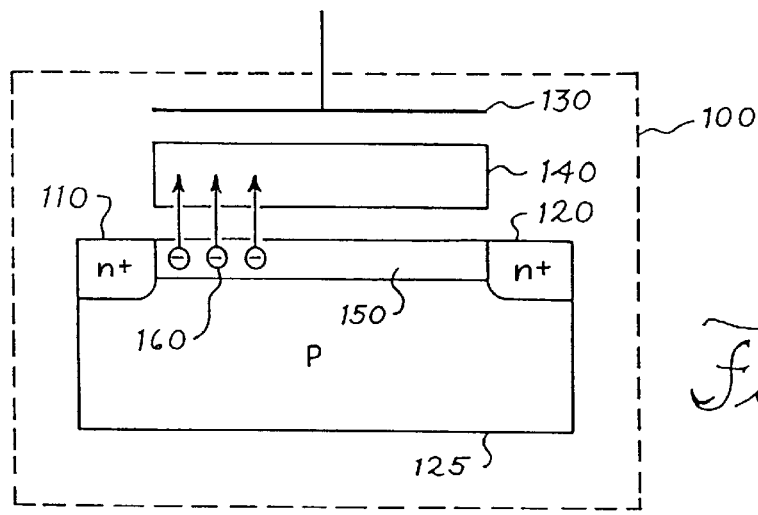
FIG. 1A depicts an individual memory element during a program operation.
Figure 1B:
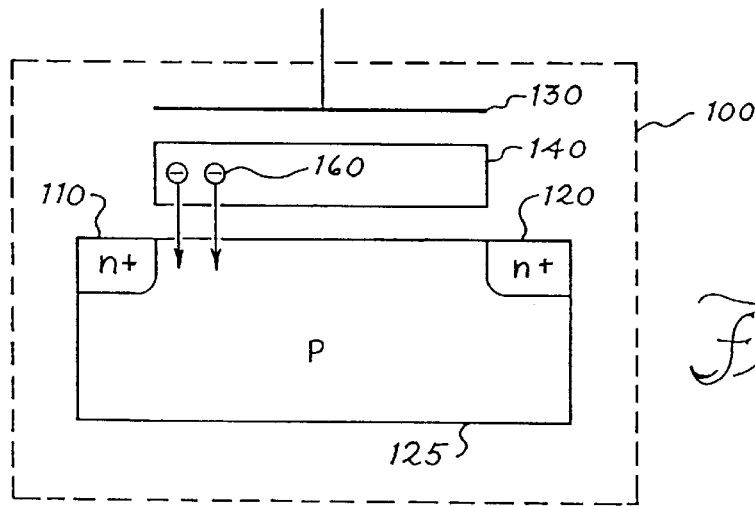
FIG. 1B depicts an individual memory element during an erase operation.
Figure 1C:
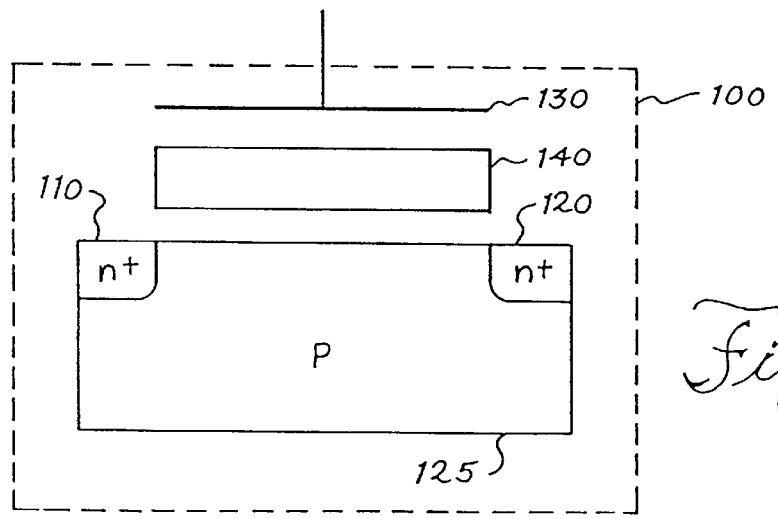
FIG. 1C depicts an individual memory element during a read operation.

The arrangement of the present invention includes essential nonvolatile memory elements. Individual memory elements can undergo three distinct operations, which are shown in FIGS. 1A, 1B and 1C. The three operations are Program, shown in FIG. 1A, Erase, shown in FIG. 1B, and Read, shown in FIG. 1C, and are described below. The following discussions will be limited to n-channel nitride-based non-volatile memory elements. Those ordinarily skilled in the art will appreciate that the basic operations described herein can be applied to a number of non-volatile memory elements, such as standard floating gate technology or multi-bit/cell non-volatile memory elements in which four states can be programmed. Multi-bit/cell memory elements may be fabricated with an oxide-nitride-oxide (ONO) layer sandwich instead of a poly floating gate layer.

The structure of the memory element 100 is well known in the art: a set of n-type semiconductor junctions comprising the source 110 and drain 120 are disposed within a p-type semiconductor well 125. The memory element 100 further includes a control gate 130 and a floating gate 140. The gates 130, 140 are conventionally formed from polysilicon deposited and patterned on the surface of the substrate, although the floating gate 140 may alternately be formed from a nitride layer. The gates 130, 140 are formed such that an oxide is formed on part of the substrate with the floating gate 140 formed above the oxide. The control gate 130 is formed above the floating gate 140 and isolated from the floating gate 140 by a second oxide. Control signals are applied to the control gate 130.

During the program operation, as shown in FIG. 1A, the drain 120 is connected with Vss (usually ground) while the source 110 of the memory element 100 is connected with a large voltage, usually >4V. The threshold voltage of the MOSFET may either be a positive or negative voltage which, when exceeded, causes a channel 150 of electrons 160 to exist in the p-type semiconductor well 125. For the case of a negative threshold voltage, the channel 150 exists when the gate 130 is set to Vss in an erased state. The channel 150 is disposed between the source 110 and drain 120 of the memory element 100. A large positive voltage is applied to the control gate 130, which causes electrons 160 to be trapped onto the nitride layer 140 via hot electron injection. The threshold voltage of the transistor is increased if electrons are trapped on the nitride layer 140. The electrons trapped on the nitride layer are usually trapped and immobilized near the source of the electrons, unlike standard floating gate technology, in which a nitride layer is not used and the trapped electrons are mobile along the floating gate.

During the erase operation, as shown in FIG. 1B, the source 110 and the drain 120 of the memory element 100 are set to a moderate voltage, usually 5–6V, while the control gate 130 is set to a moderate negative voltage, usually –5V. As a consequence, the electrons 160 trapped on the floating gate 140 enter the p-type semiconductor well 125 via Fowler-Nordheim tunneling. The threshold voltage thus ideally reverts to the original, unprogrammed threshold voltage of the transistor. Normally, a number of memory elements in a block (for example, the entire virtual ground array or only a sector of, say 512K) will be erased at the same time.

During the read operation, as shown in FIG. 1C, the source 110 of the memory element 100 is connected with Vss, which may be supplied by a bitline, while the drain is connected with a different bitline. The voltage applied to the control gate 130 of the memory element 100 is between the threshold voltage of memory elements that have been erased and memory elements that have been programmed. In one method, a moderate voltage sufficient to turn both an erased and programmed memory element on (say 4V), may be applied to the control gate 130 during a verification or read operation. The current flowing from an erased memory element will be greater than that flowing from a programmed memory element. The current flowing from the memory element 100 may thus be compared to a reference current (which may be set anywhere between that of an erased and programmed memory element). Another method entails, for threshold voltages of erased and programmed memory element of 1V and 3V respectively, applying an intermediate bias of 2V to the control gate 130. In this case, the memory element 100 will be either on or off depending on whether erased or programmed.

The overall system architecture associated with the virtual ground array is shown in FIG. 2. A comparator 260 is used to compare the output from a selected memory element contained in the memory arrangement 215 with the output from a reference circuit 245. The state of the selected memory element is obtained from the output 275 of the comparator. The reference circuit 245 contains a reference current source 240 and a reference current-to-voltage circuit 250 for transforming the reference current into a reference voltage 255. The memory arrangement 215 contains a virtual ground array 200 that includes selectable memory elements. A decoding system in the memory arrangement 215 is composed of multiplexor/decoder combinations 210 for both bitlines (columns in the virtual ground array) and word lines (rows in the virtual ground array). The output from the multiplexors/decoders 210 is one of the sensing currents from the selected memory elements. The memory arrangement 215 additionally contains a sense current-to-voltage circuit 230 that transforms the sensing current into a sensing voltage on node 265. The reference voltage on node 255 and the sensing voltage on node 265 are input to the comparator 260. The individual elements of the system are described below.

The placement of the ground in the virtual ground array 200, Vss, may be changed to different sets of nodes, unlike a typical NOR architecture in which Vss is dedicated. Of course, Vss can be an arbitrary voltage rather than ground, which alters the other applied voltages necessary for operation. This is to say that one side of a specific set of non-volatile memory elements contained in the virtual ground array may be held at a predetermined potential during an operation performed on that set of memory elements. After the operation finishes, one side of a different set of non-volatile memory elements may be held at a different (or the same) preset potential during the next operation cycle. The virtual ground array itself contains an array of memory elements arranged along intersecting word lines and bitlines.

Figure 3:
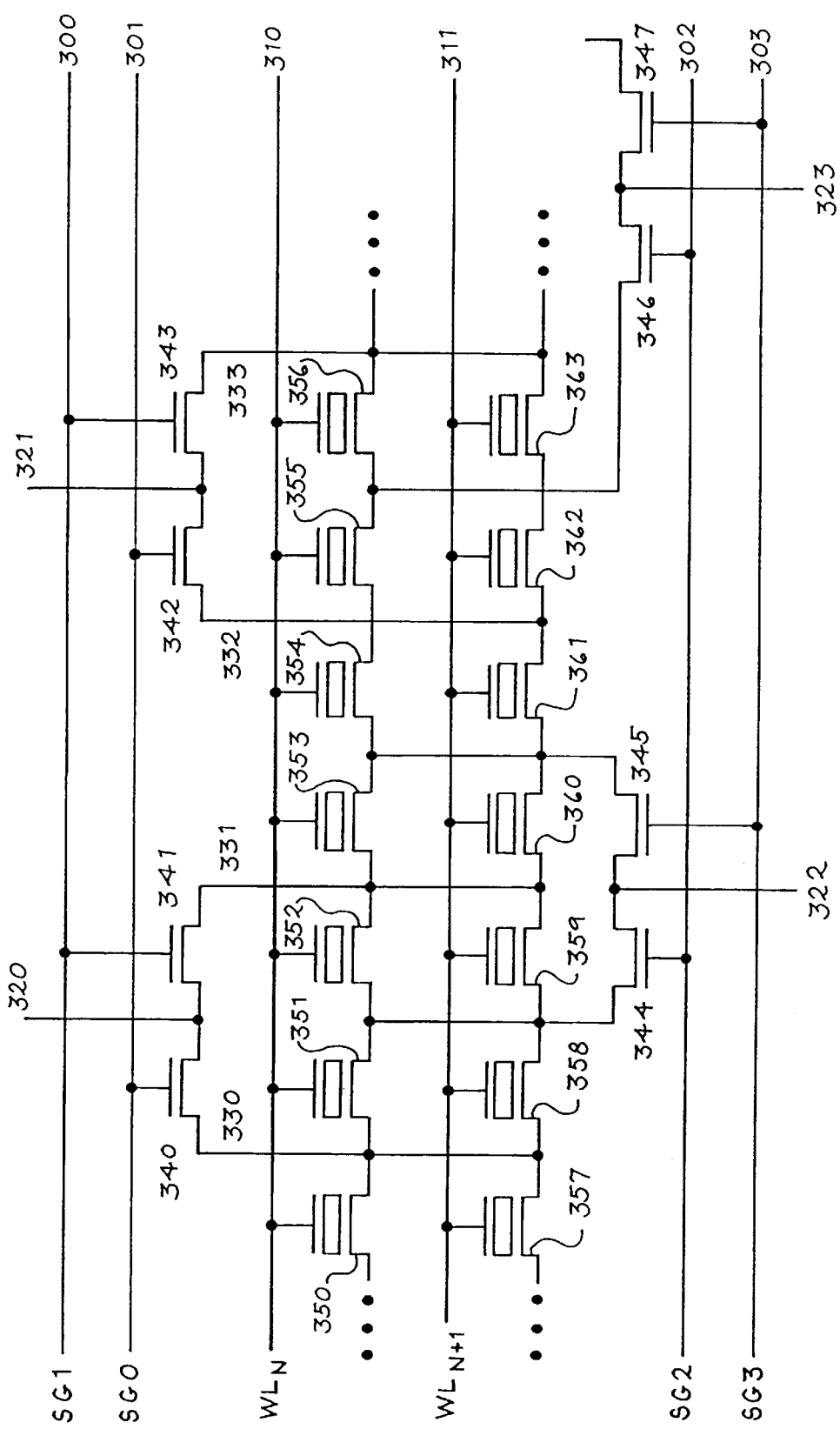
FIG. 3 depicts the architecture of a virtual ground array.

A section of the architecture of the virtual ground array of the present invention is shown in FIG. 3. The virtual ground array contains memory elements 350–363, select gates 340–347, and lines of communication 300–303, 310–311, 320–323, 330–336 that provide access to the memory elements 350–363 and select gates 340–347. The lines of communication 300–339 are divided up into row lines 300–303, 310–311 and column lines 320–323, 330–336. The row lines consist of word lines 310, 311 that address memory elements 350–363 and select gate lines 300–303 that address the select gates 340–347. The column lines 320–323, 330–336, or bitlines, consist of both global bitlines 320–323, which are connected between the select gates 340–347 and external elements such as the decoders and multiplexors 210, and local bitlines 330–336, which are connected between the select gates 340–347 and the memory elements 350–363.

In the preferred embodiment of the present invention, the global bitlines 320–323 are fabricated using a metal, such as aluminum, gold, or any other metal, alloy, or combination of metals known in the art. The local bitlines 330—336 are fabricated by diffusion of high levels of impurities into the silicon substrate 105 near the location where the memory elements 350–363 and select gates 340–347 are formed. One reason behind using diffusion as local bitlines between memory elements and select gates is that, as die sizes of the overall system architecture shrink and the number of memory elements continues to increase, conservation of real estate on a chip containing the architecture becomes increasingly important. The bitlines formed by diffusion save space as, not only does the virtual ground array not need contacts, but also the local bitlines serve as the source and drain nodes of the virtual ground array. By using diffusion to form local bitlines in the array a small, tight, and contact-less architecture can be fabricated.

As illustrated in FIG. 3, the virtual ground array is arranged such that there are four select gate lines 300–303 and two word lines 310, 311. Usually, the virtual ground array can contain any number of word lines, for example 128 word lines. Each word line has a plurality of memory elements 350–363 arranged in a series such that the source of one memory element 352 is connected with the drain of the next memory element 353. The word lines 310, 311 are connected with the control gate of the memory elements associated with the particular word line. Similarly, the select gate lines 300—303 are connected with the control gates of the select gates 340–347 associated with the particular select gate line. The memory elements contain data i.e. the state of the memory element under certain bias conditions applied to the control gate whether the memory element is programmed or erased.

Pairs of select gates are used to select a particular memory element in order to access the data contained therein. In FIG. 3, the select gate lines are divided into two pairs of select gate lines and the pairs of select gates are connected with one or the other of these pairs of select gate lines. One select gate contained in a pair of select gates is connected with one of the associated pair of select gate lines, while the other select gate contained in the pair is connected with the other select gate line. Each pair of select gates is connected with a set of pairs of memory elements by a pair of local bitlines. Each pair of the set of pairs of memory elements is disposed along a unique word line. The pairs of select gates are connected with the sets of pairs memory elements as follows: pairs of select gates connected with one pair of select gate lines are interleaved with pairs of select gates connected with the other pair of select gate lines.

Thus, as in FIG. 3, a first memory element 351 disposed along a word line 310 is connected between a first and second select gate 340, 344 by a first and second local bitline 330, 334. These select gates 340, 344 are connected with a first and second select gate line 301, 302 contained in two different pairs of select gates. A second memory element 352, adjacent to the first memory element 351, is connected between the second select gate 344 and a third select gate 341. The third select gate 341 is connected with the second memory element 352 by a third bitline 331. The third select gate 341 is connected with the first select gate 340 and a third select gate line 300. The first and third select gates 340, 341 define a first pair of select gates. A third memory element 353 is connected between the third select gate 341 and a fourth select gate 345. The fourth select gate 345 is connected with the third memory element 353 by a fourth bitline 335. The fourth select gate 345 is connected with the second select gate 344 and a fourth select gate line 303. The second and fourth select gates 344, 345 define a second pair of select gates. Thus, the first and second pair of select gates are interleaved along the word line 310.

As mentioned, specific sets of memory elements may be held at different predetermined voltages during different operation cycles. For example, to perform a read on a particular memory element 352, two select gates 341, 344 have voltages sufficient to turn them on supplied to them by two select gate lines 300, 302. One of the global bitlines 322 associated with one of the select gates 302 is held at the supply voltage, consequently setting the voltage at the drain of the memory element 352 being read via the local bitline 334. The word line 310 associated with the memory element 352 supplies the memory element 352 with the read voltage. The data is provided along the local bitline 331 through the select gate 341 to external elements (not shown) via the global bitline 320. Thus, the global bitline 320 contains output data in the form of the amount of sensing current from the selected memory element 352.

As an example, the global bitline associated with the selected memory element is biased to the supply voltage. The select gate voltage is tied to some analog level and the actual drain voltage of the selected memory element is equal to the select gate voltage minus the threshold voltage. Thus, for example, a global bitline connected with the drain of the select gate is set to about 3V. If the voltage applied to the gate of the select gate is about 2½V and the normal threshold voltage of the select gate is about 1V, the drain voltage of the selected memory element is around 1½ volts. The source voltage of the selected memory element is usually close to ground.

The sensing current is selected by the decoders/multiplexors 210 of FIG. 2 and subsequently passed to the sense current-to-voltage circuit 230 to produce the sensing voltage 265. Only one valid sensing current per output will exist because only one pair of global bitlines per output is selected, i.e. the other bitlines will float and thus no current path will exist for the other bits. In addition, a plurality of multiplexors and column decoders are necessary if there is a large number of active global bitlines to decode. Column decoders decode external addresses to produce signals that decode the bitline multiplexor. Thus, for the virtual ground array, the decoders and multiplexor must select two bitlines for every address. As described above, one of the bitlines associated with the address serves as the source and one of the bitlines associated with the address serves as the drain. However, in applications where a byte or word is read at one time, multiple pairs of memory elements may be selected for each address.

FIG. 4 depicts the architecture of the sense current-to-voltage circuit 230. The sensing current is tied to the drain of an output-activation transistor 400. The source of the output-activation transistor 400 is tied to an optional resistor 420. A bypass transistor 410 is used to vary the resistance necessary to transform the sensing current into a voltage. A set resistance 430 is connected between ground and the source of the bypass transistor 410. When the bypass transistor 410 is off, the sensing current flows through both an optional resistor 420 connected between the source and drain of the bypass transistor 410 and the set resistance 430. When the bypass transistor 410 is on, the sensing current bypasses the optional resistor 420 and only flows though the set resistance 430. The sensing voltage on node 265 is determined at a sensing node 440, which is disposed between the source of the output-activation transistor 400 and the drain of the bypass transistor 410. The sensing voltage on node 265 may thus be varied according to the desired range of voltage at the comparator 260. Of course, there can be any number of bypass transistors and optional resistors with different resistor values, as desired. A similar arrangement can be used for the reference current-to-voltage circuit 250 to produce the reference voltage on node 255. The reference current source 240 can be anything that produces a substantially constant current, e.g. a current source, a standard memory element that is only used during comparison operations, etc.

The resistances used to convert the various currents to voltages in the current-to-voltage circuits during a read operation may be set to any value. The resistances do not vary from one read cycle to the next. However, the resistances may be changed to alter the sense margin during a verification of an erase or program operation. This is to say that, after erasing or programming some of the memory elements, it is necessary to subsequently verify that the memory elements were erased or programmed to the correct threshold levels. As the resistances are variable, different resistances can be used to determine the state of the selected memory element depending on the operation. Changing the sense resistance, reference resistance, or both varies the sense ratio. Thus, by increasing the resistance on the sense side, the sense current necessary to detect a change of state of a selected memory element is decreased i.e. the signal margin to the comparator 260 is increased. For example, applying the same voltage to the control gate of the memory element after a program results in a smaller current than after an erase because of the increase in threshold voltage. Thus, by increasing the sense resistance during a program verify, the same sense voltage can be maintained. Similarly, the reference resistance can be changed and the optimal mix of variation to alter the signal margin to the comparator 260 may be determined based on the current expected.

In addition, the resistances may be varied due to the non-ideality of the comparator 260 or to adjust for changes in the sensing current. Variations in the sensing current occur, for example, as charge trapping occurs. Charge trapping will eventually take place in the floating gate as the memory element is perpetually programmed and erased. The threshold voltage of the memory element increases as a result of charge trapping. As the amount of charge trapped increases, the same voltage applied to the gate of the selected memory element will drive a decreasing amount of current. Thus, to maintain the same margin to the comparator 260, either the resistance in the sensing circuit must be increased or the resistance in the reference circuit must be decreased.

The comparator 260 subsequently compares the sensing voltage 265 and the reference voltage 255. The comparator 260 will not be described herein as any standard comparator may be used. In general, the comparator will be some type of differential amplifier with an active mirror circuit. The output of the comparator 260 is used by external components to store or display information about the state of the selected memory element.

Thus, in the preferred embodiment of the invention, an apparatus and method is provided to sense the direct current from the source side of a specific memory element contained in a virtual ground array. A group of memory elements is selected by select gates, which are in turn selected by select gate lines. The memory elements in the virtual ground array are disposed in series along word lines and connected by local bitlines with the select gates. Both the select gates and a particular word line select a specific set of memory elements. Global bitlines, which connect the select gates with the elements external to the virtual ground array, are then used to both supply a voltage to the drain side of the set of memory elements and direct current from the source side of the set of memory elements. At least one multiplexor and column decoder select the current from one of the set of memory elements. The current from the selected memory element is then transformed into a sense voltage by a sense load. Similarly, current from a reference current source is transformed into a reference voltage by a reference load. The reference load and the sense load may be unequal or equal and are varied, depending on the sense margin desired. The sense voltage and reference voltage are then compared by a comparator and the state of the selected memory element is then determined using the output of the comparator.

By sensing the direct current produced by a selected memory element in a virtual ground array it is possible to save both power consumption and processor time over prior sensing schemes. The advantages originate primarily from sensing from the source of the selected memory element, as it is not necessary to precharge the bitlines connected to the memory elements not being sensed to the drain voltage. In addition, sensing by using the direct current from the selected memory element rather than dynamic (AC) sensing, extremely accurate timing of the signals is not necessary, i.e. sensing the direct current is safer.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. An apparatus for direct current sensing from the source side of memory elements in a virtual ground array, the apparatus comprising:

a virtual ground array containing memory elements, select gates, select gate lines connected with the select gates, word lines, global bitlines, and local bitlines connecting the select gates with the memory elements, each of the memory elements having a source and a drain, the virtual ground array operative to select a set of memory elements and fix the drains of the set of memory elements to a predetermined potential; and a comparison circuit containing a reference circuit and a comparator comparing an output of the reference circuit to a direct current obtained from the source of a selected memory element in the set of memory elements in the virtual ground array, wherein the word lines and at least two of the select gates select the set of memory elements and the global bitlines connect the select gates with the comparator.

2. The apparatus of claim 1, further comprising:

at least one multiplexor connected with the virtual ground array and the comparator operative to select one of the set of memory elements; and at least one column decoder connected with the set of memory elements and the comparator operative to decode the set of memory elements.

3. The apparatus of claim 1, further comprising:

a sense load operative to transform the direct current provided from the source of the selected memory element into a sense voltage inputted to the comparator; and a reference load operative to transform a current provided from the reference circuit into a reference voltage inputted to the comparator.

4. The apparatus of claim 3, wherein the reference load and the sense load have the same resistance value.

5. The apparatus of claim 3, wherein the reference load and the sense load have different resistance values, thereby creating a sense ratio.

6. The apparatus of claim 3, wherein at least one of the sense load and the reference load is variable and controls a margin necessary to determine the direct current.

7. The apparatus of claim 3, wherein the local bitlines are formed by a diffusion process and the global bitlines are composed of metal.

8. The apparatus of claim 3, wherein:

the memory elements disposed along each word line are arranged in series along the word line; and the virtual ground array is arranged such that a first set of pairs of select gates are connected with a first set of pairs of memory elements, a second set of pairs of select gates are connected with a second set of pairs of memory elements, and the first set of pairs of memory elements and second set of pairs of memory elements partially overlap each other.

9. The apparatus of claim 1, further comprising:

a sense converter to transform the direct current provided from the source of the selected memory element into a sense voltage supplied to a first input of the comparator; and a reference converter to transform a current provided from the reference circuit into a reference voltage supplied to a second input of the comparator, one of the sense converter and the reference converter comprising a pair of transistors connected in series, the one of the sense converter and the reference converter disposed between the source of the selected memory element and ground or between an output of the reference circuit and ground, an output of the one of the sense converter and the reference converter supplied to a corresponding input of the comparator and provided from a point between the pair of transistors, the one of the sense converter and the reference converter further comprising a first load disposed between one of the pair of transistors and the ground.

10. The apparatus of claim 9, further comprising a second load disposed between a source and a drain of the one of the pair of transistors.

11. The apparatus of claim 1, further comprising:

a sense converter to transform the direct current provided from the source of the selected memory element into a sense voltage supplied to a first input of the comparator, the sense converter comprising a first pair of transistors connected in series and disposed between the source of the selected memory element and ground, an output of the sense converter supplied to the first input of the comparator and provided from a point between the first pair of transistors, the sense converter further comprising a first load disposed between one of the first pair of transistors and the ground; and a reference converter to transform a current provided from the reference circuit into a reference voltage supplied to a second input of the comparator, the reference converter comprising a second pair of transistors connected in series and disposed between an output of the reference circuit and ground, an output of the reference converter supplied to the second input of the comparator and provided from a point between the second pair of transistors, the reference converter further comprising a second load disposed between the one of the second pair of transistors and the ground.

12. The apparatus of claim 11, further comprising a third load disposed between a source and a drain of the one of the second pair of transistors.

13. The apparatus of claim 11, wherein the first load and the second load have the same resistance value.

14. The apparatus of claim 11, wherein the first load and the second load have different resistance values.

15. The apparatus of claims 11, wherein at least one of the first load and the second load is variable.

16. The apparatus of claim 11, further comprising a third load disposed between a source and a drain of the one of the first pair of transistors.

17. The apparatus of claim 16, further comprising a fourth load disposed between a source and a drain of the one of the second pair of transistors.

18. An apparatus for direct current sensing from the source side of memory elements in a virtual ground array, the apparatus comprising:

a virtual ground array consisting of select gates selectable by select gate lines, memory elements having a source and a drain, the memory elements selectable by word lines and at least two of the select gates and arranged in series along the word lines, local bitlines connecting the select gates with the memory elements, and global bitlines connecting the select gates with the comparator, and arranged such that sets of memory elements are selected in pairs along each word line by two partially overlapping pairs of select gates, wherein an output of the virtual ground array is direct current from the source of selected memory elements and the pairs of select gates and associated global and local bitlines are operative to set the drain of the selected memory elements to a set potential;

at least one multiplexor connected with the virtual ground array and the comparator that selects one of the selected memory elements as the origin of direct current input to a sense load and at least one column decoder connected with the set of memory elements and the comparator operative to decode the set of memory elements; and a comparison circuit containing a reference circuit that contains a source of a reference current and a reference load to transform the reference current into a reference voltage, the sense load to transform a direct current from the virtual ground array into a sense voltage, and a comparator comparing the reference voltage and the sense voltage.

19. The apparatus of claim 18, or wherein the reference load and the sense load have the same resistance value.

20. The apparatus of claim 18, wherein the reference load and the sense load have different resistance values, thereby creating a sense ratio.

21. The apparatus of claim 18, wherein at least one of the sense load and the reference load is variable and controls a margin necessary to determine the direct current.

22. The apparatus of claim 18, wherein the local bitlines are formed by a diffusion process and the global bitlines are composed of metal.

23. A method of direct current sensing from the source side of memory elements in a virtual ground array, the method comprising:

selecting a set of memory elements having a source and a drain contained in the virtual ground array;

comparing a direct current obtained from the source of a selected memory element contained in the set of memory elements with a reference current from a reference circuit via a comparator; and determining the direct current using an output of the comparator, the virtual ground array comprising memory elements, select gates, select gate lines connected with the select gates, word lines, global bitlines, and local bitlines connecting the select gates with the memory elements, wherein the word lines and at least two of the select gates select the set of memory elements and the global bitlines connect the select gates with the comparator.

24. The method of claim 23, further comprising:

selecting the direct current via at least one multiplexor connected with the virtual ground array and the comparator; and decoding the selected direct current via at least one decoder connected with the virtual ground array and the comparator.

25. The method of claim 23, further comprising:

transforming the direct current into a sense voltage fed into the comparator via a sense load; and transforming the reference current into a reference voltage fed into the comparator via a reference load.

26. The method of claim 25, further comprising setting the reference load and the sense load to be unequal and thereby creating a sense ratio.

27. The method of claim 25, the determining further comprising varying at least one of the sense load and the reference load thereby controlling a necessary margin.

28. The method of claim 25, further comprising arranging the memory elements disposed along each word line in series along the word line; and arranging the virtual ground array such that a first set of pairs of select gates are connected with a first set of pairs of memory elements, a second set of pairs of select gates are connected with a second set of pairs of memory elements, and the first set of pairs of memory elements and second set of pairs of memory elements partially overlap each other; and forming the local bitlines by a diffusion process, the global bitlines composed of metal.

* * * * *